(12) United States Patent
Chen et al.

(10) Patent No.: US 9,495,931 B2
(45) Date of Patent: Nov. 15, 2016

(54) SHIFT REGISTER, DISPLAY DEVICE AND METHOD FOR DRIVING DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaochuan Chen, Beijing (CN); Shijun Wang, Beijing (CN); Lei Wang, Beijing (CN); Yanna Xue, Beijing (CN); Wenbo Jiang, Beijing (CN); Yue Li, Beijing (CN); Zhiying Bao, Beijing (CN); Zhenhua Lv, Beijing (CN); Wenjun Xiao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 125 days.

(21) Appl. No.: 14/540,287

(22) Filed: Nov. 13, 2014

(65) Prior Publication Data
US 2015/0380107 A1     Dec. 31, 2015

(30) Foreign Application Priority Data
Jun. 25, 2014 (CN) .......................... 2014 1 0291291

(51) Int. Cl.
G11C 19/00 (2006.01)
G09G 3/36 (2006.01)
G11C 19/28 (2006.01)

(52) U.S. Cl.
CPC .......... *G09G 3/3677* (2013.01); *G11C 19/287* (2013.01); *G09G 2310/0205* (2013.01); *G09G 2310/0286* (2013.01); *G09G 2310/062* (2013.01); *G11C 19/28* (2013.01)

(58) Field of Classification Search
None
See application file for complete search history.

(56) References Cited

U.S. PATENT DOCUMENTS

| 7,903,076 B2* | 3/2011 | Hsu | G06F 1/3203 345/100 |
|---|---|---|---|
| 8,102,962 B2* | 1/2012 | Liu | G11C 19/28 377/64 |
| 8,718,223 B2* | 5/2014 | Murakami | G09G 3/3677 327/108 |
| 2008/0219401 A1* | 9/2008 | Tobita | G09G 3/3677 377/79 |
| 2009/0175405 A1* | 7/2009 | Chen | G11C 19/184 377/68 |
| 2013/0169319 A1* | 7/2013 | Sasaki | G11C 19/184 327/108 |
| 2014/0062847 A1* | 3/2014 | Chien | G09G 3/3677 345/100 |
| 2014/0159999 A1* | 6/2014 | Gu | G09G 3/3677 345/100 |
| 2014/0320175 A1* | 10/2014 | Li | G09G 3/3674 327/109 |

(Continued)

*Primary Examiner* — Tuan T Lam
(74) *Attorney, Agent, or Firm* — Harness, Dickey & Pierce, P.L.C.

(57) ABSTRACT

The present disclosure provides a shift register, a display device, and a method for driving the display device. A pull-down module and a stop module are added in the shift register. When a full screen picture is displayed, the signal output port outputs a high-level signal to the gate line connected with the signal output port, such that the gate line scans the display panel of the display device normally. The pull-down module may maintain the pull-up node and the signal output port at a low-level during the non-working time of the shift register, so as to prevent the shift register from outputting noise. When a local picture is displayed, under the control of the stop signal input port Stop, the stop module outputs the low-level signal to the gate line connected with the signal output port, such that the gate line stops scanning the display panel.

11 Claims, 6 Drawing Sheets

(56) References Cited

U.S. PATENT DOCUMENTS

2015/0016584 A1* 1/2015 Dun .................. G11C 27/04
377/68

2015/0294734 A1* 10/2015 Chan .................. H03K 17/161
327/109
2015/0364079 A1* 12/2015 Nie ..................... G09G 3/2096
377/68

* cited by examiner

SHIFT REGISTER, DISPLAY DEVICE AND METHOD FOR DRIVING DISPLAY DEVICE

CROSS-REFERENCE TO RELATED APPLICATION

This application claims priority to Chinese Patent Application No. 201410291291.4 filed on Jun. 25, 2014, the disclosures of which are incorporated in their entirety by reference herein.

TECHNICAL FIELD

The present disclosure generally relates to the field of display technology and, more particularly, relates to a shift register, a display device and a method for driving the display device.

BACKGROUND

With the development of Liquid Crystal Display (LCD) technology, LCD products have higher and higher requirements for power consumption. How to reduce the power consumption during the displaying of some local pictures by the LCD product becomes very important.

In Thin Film Transistor Liquid Crystal Display (TFT-LCD), a gate driving signal is usually provided to a gate electrode of each Thin Film Transistor (TFT) in a pixel region via a gate line driving device. A gate line driver circuit of the gate line driving device includes a plurality of shift registers. A structure of a conventional shift register circuit is depicted FIG. 1. As shown in FIG. 1 when four TFTs (M1-M4) and one capacitor (C1) are used, the basic function of a shift register may be achieved. The specific working principle is as following: when a high-level signal is inputted into a signal input port (Input), a first TFT M1 is turned on and starts to charge a pull-up node (PU); when a high-level signal is inputted to a clock signal port (CLK), a third TFT M3 is turned on to enable signal output port (Output) to output the high-level signal provided by CLK, at the same time, the self-elevation of C1 further elevates PU to a high level; after that, when a high-level signal is inputted into a reset signal port (Reset), a second TFT M2 and a fourth TFT M4 are turned on and start to discharge PU and a signal output port Output.

However, when the display device displays some local pictures, for example, as shown in FIG. 2, when the display device is in a standby status, most of the screen is in black background except the part of the screen corresponding to the clock picture. At this time, each shift register circuit of the display device is still outputting the gate electrode scanning signal to the corresponding gate line; each gate line progressively scans the display panel of the entire TFT-LCD; all data lines are inputting signals to conduct pixel driving, such that the display device displays the required picture. This kind of driving mode has high power consumption.

Thus, how to reduce the power consumption when the local picture is displayed becomes a problem that needs to be solved in this field.

SUMMARY

The present disclosure provides a shift register, an array substrate, a display device, and a method for driving the display device to solve the problem of high power consumption in current technology when a local picture is displayed by the display device.

The present disclosure provides a shift register including a pull-up driver module, a pull-down driver module, a pull-up control module, a pull-down control module, a pull-down module, and a stop module, wherein the pull-up driver module is configured to turn on the pull-up control module through a pull-up node under a control of a signal input port and a first reference signal port;

the pull-down driver module is configured to turn off the pull-up control module through the pull-up node under a control of a reset signal port (Reset) and a second reference signal port;

the pull-up control module is configured to connect a first clock signal port and a signal output port under a control of the pull-up node;

the pull-down control module is configured to connect a low-level signal port and the signal output port under a control of a second clock signal port;

the pull-down module is configured to maintain the pull-up node and the signal output port at a low-level during non-working time of the shift register, and to be connected with the signal output port, the pull-up node, the low-level signal port, and the first clock signal port; and the stop module is configured to maintain the signal output port at the low-level under a control of a stop signal input port, and to be connected with the stop signal input port, the pull-up node, the pull-down module, and the low-level signal port.

In the shift register provided by the present disclosure, the pull-down module and the stop module are added in. When a full screen picture is displayed by the display device, the signal output port (Output) of the shift register outputs a high-level signal to the gate line connected with the signal output port, such that the gate line scans the display panel of the display device normally to display full screen picture. In addition, the pull-down module may maintain the pull-up node (PU) and the signal output port (Output) at a low-level during the non-working time of the shift register, so as to prevent the shift register from outputting noise. When a local picture is displayed by the display device, under the control of the stop signal input port Stop, the stop module of the shift register maintains the signal output port (Output) at a low-level, i.e., the signal output port (Output) outputs the low-level signal to the gate line connected with the signal output port, such that the gate line stops scanning the display panel to display black background except the local picture. Compared with the prior art, i.e., when a local picture is displayed by the display device, each shift register circuit of the display device keeps outputting a high-level signal to each corresponding gate line to conduct normal scanning, the shift register of this embodiment may reduce the power consumption of the display device.

In another embodiment, in the shift register, the pull-up driver module includes a first TFT, a gate electrode of the first TFT is connected with the signal input port, a drain electrode of the first TFT is connected with the first reference signal port, and a source electrode of the first TFT is connected with the pull-up node;

the pull-down driver module includes a second TFT, a gate electrode of the second TFT is connected with the reset signal port, a drain electrode of the second TFT is connected with the pull-up node, a source electrode of the second TFT is connected with the second reference signal port;

the pull-up control module includes a third TFT and a first capacitor, a gate electrode of the third TFT is connected with the pull-up node, a source electrode of the third TFT is connected with the first clock signal port, a drain electrode of the third TFT is connected with the signal output port, the first capacitor is connected between the pull-up node and the signal output port; and the pull-down control module includes a fourth TFT, a gate electrode of the fourth TFT is connected with the second clock signal port, a drain electrode of the fourth TFT is connected with the signal output port, a source electrode of the fourth TFT is connected with the low-level signal port.

In another embodiment, the stop module of the shift register further includes a fifth TFT, a gate electrode of the fifth TFT and a drain electrode of the fifth TFT are both connected with the stop signal input port; a source electrode of the fifth TFT is connected with the pull-down module. When a high-level signal is inputted into the stop signal input port, the fifth TFT is turned on, the fifth TFT in an on-state turns on the pull-down module such that the signal output port and the low-level signal port are connected.

In another embodiment, the stop module of the shift register further includes a sixth TFT, a gate electrode of the sixth TFT is connected with the stop signal input port, a drain electrode of the sixth TFT is connected with the pull-up node, and a source electrode of the sixth TFT is connected with the low-level signal port.

In another embodiment, the pull-down module of the shift register includes:
 a seventh TFT, wherein a gate electrode of the seventh TFT is connected with a pull-down node, a source electrode of the seventh TFT is connected the signal output port, a drain electrode of the seventh TFT is connected with the low-level signal port;
 an eighth TFT, wherein a gate electrode of the eighth TFT is connected with the pull-up node, a drain electrode of the eighth TFT is connected with the low-level signal port, a source electrode of the eighth TFT is connected with the pull-down node;
 a ninth TFT, wherein a gate electrode of the ninth TFT is connected with the pull-down node, a source electrode of the ninth TFT is connected with the pull-up node, a drain electrode of the ninth TFT is connected with the low-level signal port; and
 a second capacitor, wherein the second capacitor is connected between the pull-down node and the first clock signal port.

In the shift register according to an embodiment, the signal input port and the reset signal port are in symmetrical design so as to achieve dual-scanning.

Alternatively, when a forward scanning is started, the first reference signal port provides a high-level signal, and the second reference signal port provides a low-level signal; or when a reverse scanning is started, the first reference signal port provides a low-level signal, and the second reference signal port provides a high-level signal.

A gate electrode driver circuit provided by the present disclosure includes a plurality of shift registers connected in series. Except a first shift register and a last shift register, a signal output port of every other shift register sends a triggering signal to a signal input port of a next adjacent shift register and sends a reset signal to a reset signal port of a previous adjacent shift register. A signal output port of the first shift register sends a triggering signal to a signal input port of the second shift register. A signal output port of the last shift register sends a reset signal to the reset signal port of a previous shift register.

An array substrate provided by the present disclosure includes a gate electrode driver circuit provided by the present disclosure, a gate line connected with a signal output port of a shift register of the gate electrode driver circuit, a TFT, a data line, and a pixel electrode,
 wherein a gate electrode of the TFT is connected with the gate line, a source electrode of the TFT is connected with the data line, and a drain electrode of the TFT is connected with the pixel electrode.

A display device provided by the present disclosure includes an array substrate provided by the present disclosure and a driver circuit of the array substrate.

A method for driving a display device provided by the present disclosure, comprising:
 receiving external video data, by a driver circuit of the display device, wherein when the external video data is determined to display a local picture, after the local picture is displayed, a stop display signal is sent to a stop signal input port of each of shift registers in the display device; and
 sending, by a signal output port of the shift register, a low-level signal to a gate line connected to the shift register when the stop display signal is received by the shift register.

In the method for driving the display device provided by the present disclosure, after a driver circuit receives external video data, when the external video data is determined to display a local picture and after the local picture is displayed, a stop display signal is sent to a stop signal input port of each of shift registers in the display device. A signal output port of the shift register sends a low-level signal to a gate line connected to the shift register when the stop display signal is received by the shift register, such that the gate line stops scanning of the display panel to display the black background except the local picture. Compared with the prior art, i.e., when a local picture is displayed by the display device, each shift register circuit of the display device keeps outputting a high-level signal to each corresponding gate line to conduct normal scanning, the shift register of this embodiment may reduce the power consumption of the display device.

In another embodiment, the method for driving the display device further comprising:
 at the same time that the driver circuit sends the stop display signal to the stop signal input port of each of the shift registers in the display device, sending the low-level signal to a source driver circuit of the display device such that a data line connected with the source driver circuit is loaded with the low-level signal.

DETAILED DESCRIPTION

In order to understand the present disclosure in a better manner, the present disclosure is described hereinafter in conjunction with the drawings and the embodiments.

Figure 1:
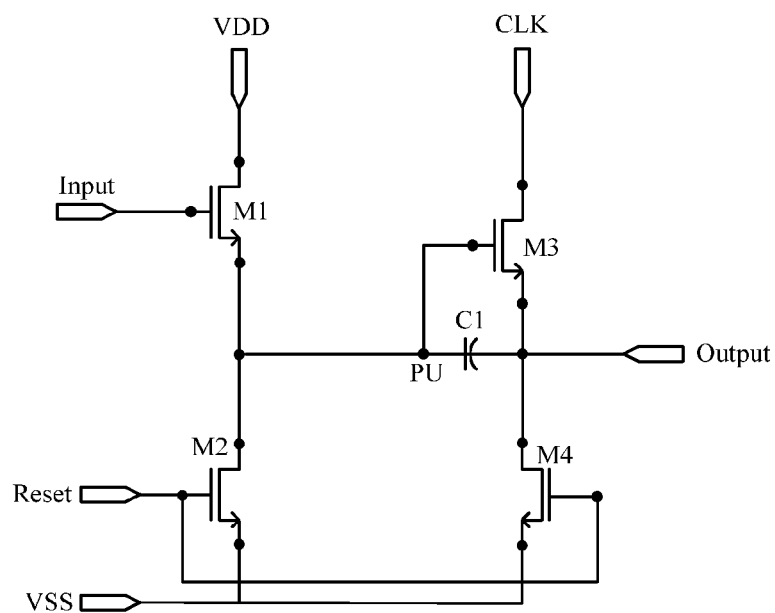
FIG. 1 is a schematic structural view showing a shift register in current technology.
Figure 2:
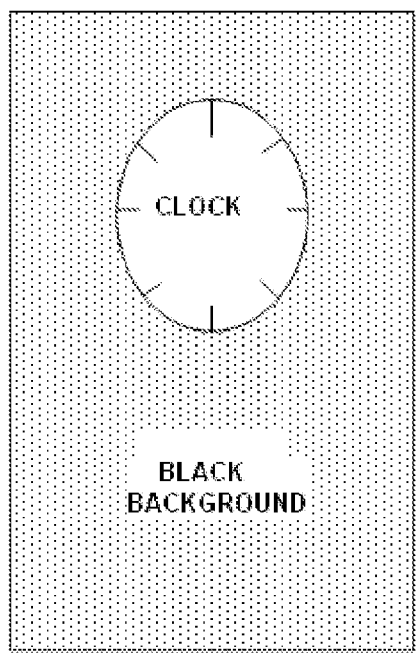
FIG. 2 is a schematic view showing a local picture displayed by a display device in current technology.
Figure 3:
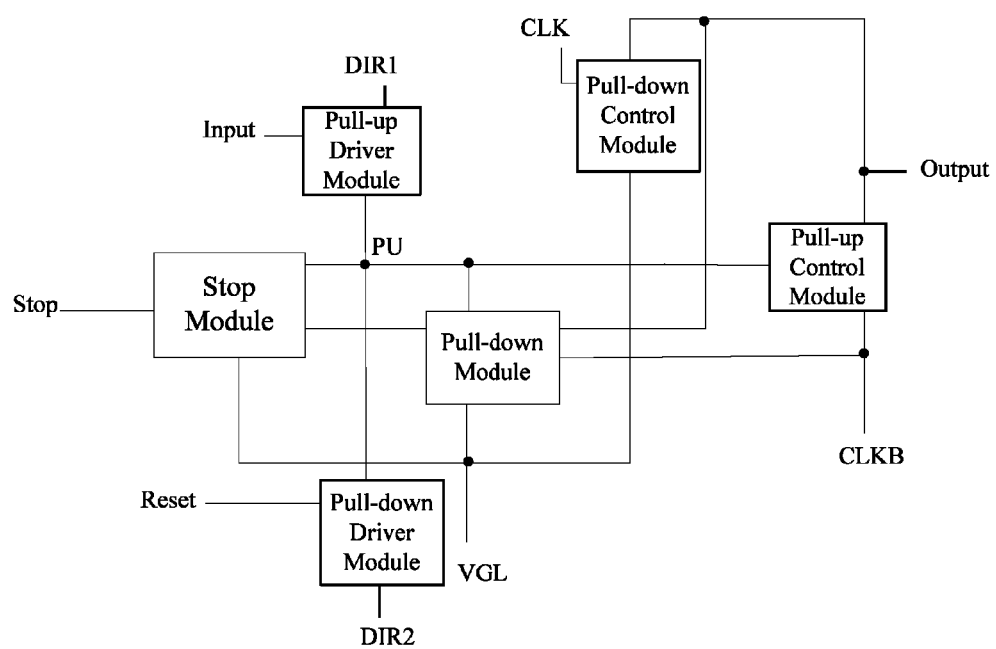
FIG. 3 is a schematic structural view showing a shift register according to an embodiment of the present disclosure.

As shown in FIG. 3, the present disclosure provides a shift register including a pull-up driver module, a pull-down driver module, a pull-up control module, a pull-down control module, a pull-down module, and a stop module.

The pull-up driver module is configured to turn on the pull-up control module through a pull-up node (PU) under a control of a signal input port (Input) and a first reference signal port (DIR1). The pull-down driver module is configured to turn off the pull-up control module through the pull-up node (PU) under a control of a reset signal port (Reset) and a second reference signal port (DIR2). The pull-up control module is configured to connect a first clock signal port (CLKB) and a signal output port (Output) under a control of the pull-up node (PU). The pull-down control module is configured to connect a low-level signal port (VGL) and the signal output port (Output) under a control of a second clock signal port (CLK). The pull-down module is configured to maintain the pull-up node (PU) and the signal output port (Output) at a low-level during non-working time of the shift register, and to be connected with the signal output port (Output), the pull-up node (PU), the low-level signal port (VGL), and the first clock signal port (CLKB). The stop module is configured to maintain the signal output port (Output) at the low-level under a control of a stop signal input port (Stop), and to be connected with the stop signal input port (Stop), the pull-up node (PU), the pull-down module, and the low-level signal port (VGL).

In the shift register according to an embodiment of the present disclosure, the pull-down module and the stop module are added in. When a full screen picture is displayed by the display device, the signal output port (Output) of the shift register outputs a high-level signal to the gate line connected with the signal output port, such that the gate line scans the display panel of the display device normally to display a full screen picture. In addition, the pull-down module may maintain the pull-up node (PU) and the signal output port (Output) at a low-level during the non-working time of the shift register, so as to prevent the shift register from outputting noise. When a local picture is displayed by the display device, under the control of the stop signal input port (Stop), the stop module of the shift register maintains the signal output port (Output) at a low-level, i.e., the signal output port (Output) outputs the low-level signal to the gate line connected with the signal output port, such that the gate line stops scanning the display panel to display black background except the local picture region. Compared with the prior art, i.e., when a local picture is displayed by the display device, each shift register circuit of the display device keeps outputting high-level signals to each corresponding gate line to conduct normal scanning, the shift register of this embodiment may reduce the power consumption of the display device.

Figure 4:
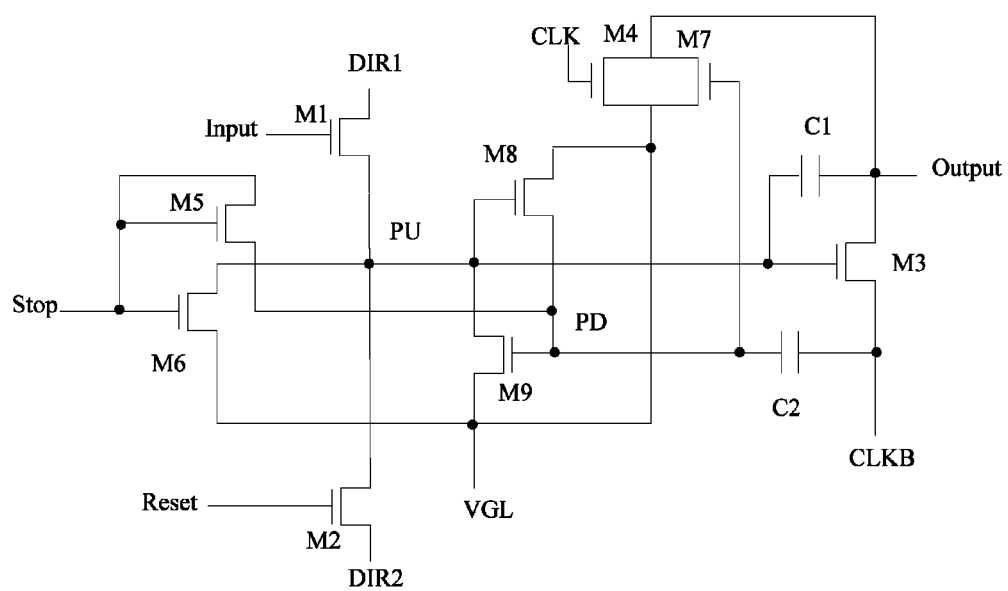
FIG. 4 is a specific schematic structural view showing a shift register according to an embodiment of the present disclosure.

More specifically, the pull-up driver module, the pull-down driver module, the pull-up control module, and the pull-down control module in the shift register of the present disclosure may have more alternative structures, as shown in FIG. 4. The pull-up driver module includes a first TFT (M4), a gate electrode of the first TFT is connected with the signal input port (Input), a drain electrode of the first TFT is connected with the first reference signal port (DIR1), and a source electrode of the first TFT is connected with the pull-up node (PU). The pull-down driver module includes a second TFT (M2), a gate electrode of the second TFT is connected with the reset signal port (Reset), a drain electrode of the second TFT is connected with the pull-up node (PU), a source electrode of the second TFT is connected with the second reference signal port (DIR2). The pull-up control module includes a third TFT (M3) and a first capacitor (C1), a gate electrode of the third TFT is connected with the pull-up node (PU), a source electrode of the third TFT is connected with the first clock signal port (CLKB), a drain electrode of the third TFT is connected with the signal output port (Output), the first capacitor (C1) is connected between the pull-up node (PU) and the signal output port (Output). The pull-down control module includes a fourth TFT (M4), a gate electrode of the fourth TFT is connected with the second clock signal port (CLK), a drain electrode of the fourth TFT is connected with the signal output port (Output), a source electrode of the fourth TFT is connected with the low-level signal port (VGL).

In another embodiment, when the signal input port (Input) inputs a high-level signal, the first TFT (M1) is turned on. The first TFT (M1) in an on-state electronically connects the pull-up node (PU) and the first reference signal port (DIR1), and elevates the pull-up node (PU) to a high-level so as to turn on the third TFT (M3) and charge the first capacitor (C1). The third TFT (M3) in an on-state connects the signal output port (Output) and the first clock signal port (CLKB). When the reset signal port (Reset) is inputted with a high-level signal, the second TFT (M2) is turned on. The second TFT (M2) in an on-state connects the pull-up node (PU) and the second reference signal port (DIR2), and reduces the pull-up node (PU) to a low-level so as to turn off the third TFT (M3). When the second clock signal port is inputted with a high-level signal, the fourth TFT (M4) is turned on. The fourth TFT (M4) in an on-state connects the signal output port (Output) and the low-level signal port (VGL), such that the signal output port (Output) outputs the low-level signal.

In another embodiment, in order to maintain the signal output port (Output) at a low-level under the control of the stop signal input port (Stop), a stop module in the shift register includes a fifth TFT (M5), as shown in FIG. A gate electrode of the fifth TFT and a drain electrode of the fifth TFT are both connected with the stop signal input port (Stop). A source electrode of the fifth TFT is connected with the pull-down module. Thus, when a local picture is displayed by the display device, the stop signal input port (Stop) inputs a high-level signal to turn on the fifth TFT (M5). The fifth TFT (M5) in an on-state turns on the pull-down module to connect the signal output port (Output) and the low-level signal port (VGL). The signal output port (Output) of the shift register outputs a low-level signal to the gate line connected with the signal output port, such that the gate line stops scanning the display panel of display device. Thus, the goal of reducing the power consumption when the local picture is displayed by the display device is achieved.

Further, in order to maintain the signal output port (Output) at a low-level under the control of the stop signal input port (Stop) when the local picture is displayed by a display device, a stop module includes a sixth TFT (M6), as shown in FIG. 4. A gate electrode of the sixth TFT is connected with the stop signal input port (Stop). A drain electrode of the sixth TFT is connected with the pull-up node (PU). A source electrode of the sixth TFT is connected with the low-level signal port (VGL). Thus, when the local picture is displayed by the display device, the stop signal input port (Stop) inputs a high-level signal to turn on the sixth TFT (M6). The sixth TFT (M6) in an on-state electronically connects the pull-up node (PU) and the low-level signal port (VGL), and reduces the pull-up node (PU) to a low-level so as to maintain the signal output port (Output) at a low-level.

More specifically, the pull-down module of the shift register provided by the present disclosure may have more alternative structures, as shown in FIG. 4, including a seventh TFT (M7), an eighth TFT (M8), a ninth TFT (M9), and a second capacitor (C2). A gate electrode of the seventh TFT is connected with a pull-down node (PD). A source electrode of the seventh TFT (M7) is connected the signal output port (Output). A drain electrode of the seventh TFT is connected with the low-level signal port (VGL). A gate electrode of the eighth TFT (M8) is connected with the pull-up node (PU). A drain electrode of the eighth TFT is connected with the low-level signal port (VGL). A source electrode of the eighth TFT is connected with the pull-down node (PD). A gate electrode of the ninth TFT (M9) is connected with the pull-down node (PD). A source electrode of the ninth TFT is connected with the pull-up node (PU). A drain electrode of the ninth TFT is connected with the low-level signal port (VGL). The second capacitor (C2) is connected between the pull-down node (PD) and the first clock signal port (CLKB).

More specifically, in the shift register provided by the present disclosure, when the local picture is displayed by the display device, the stop signal port (Stop) inputs a high-level signal to turn on the fifth TFT (M5) and the sixth TFT (M6) in the stop module. The fifth TFT (M5) in an on-state elevates the pull-down node (PD) to a high-level, so as to turn on the seventh TFT (M7) and the ninth TFT (M9) in the pull-down module. The seventh TFT (M7) in an on-state connects the signal output port (Output) and the low-level signal port (VGL). The signal output port (Output) of the shift register outputs a low-level signal to the gate line connected with the signal output port. The ninth TFT (M9) in an on-state connects the pull-up node (PU) and the low-level signal port (VGL), so as to reduce the pull-down node (PD) to a low-level. The sixth TFT (M6) in an on-state may connect the pull-up node (PU) and the low-level signal port (VGL), so as to ensure the noise of the pull-up node (PU) may be outputted.

Further, because the signal input port (Input) and the reset signal port (Reset) of the shift register of the present disclosure are in symmetrical design and are functionally interchangeable; the shift register of the present disclosure may achieve dual-scanning in both directions.

Generally, when a forward scanning is started, the first reference signal port (DIR1) provides a high-level signal, and the second reference signal port (DIR2) provides a low-level signal. Generally, when a reverse scanning is started, the first reference signal port (DIR1) provides a low-level signal, and the second reference signal port (DIR2) provides a high-level signal.

Figure 5:
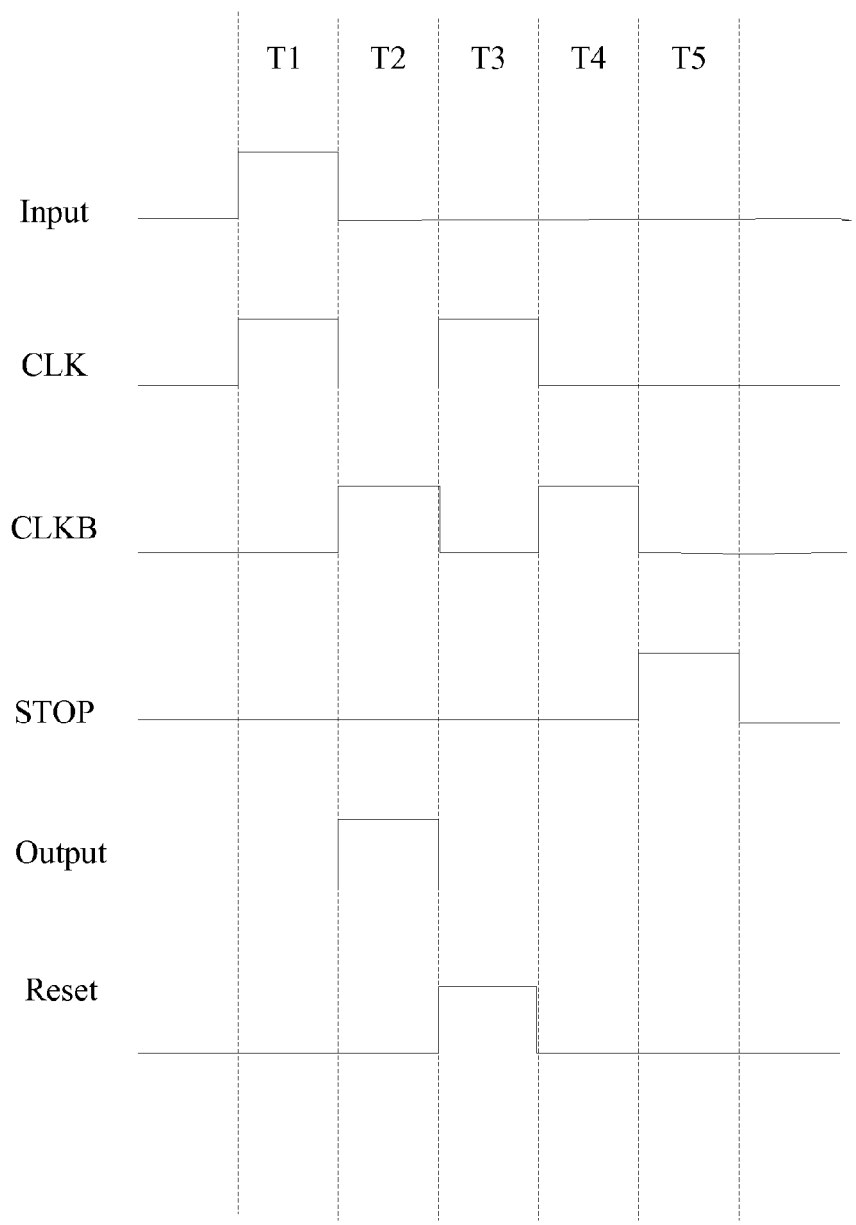
FIG. 5 is an input-output time sequence diagram of a shift register according to an embodiment of the present disclosure.

In conjunction with the shift register shown in FIG. 4 and the input-output time sequence diagram shown in FIG. 5, a working process of the shift register provided by the present disclosure is described by taking forward scanning as an example. Specifically, FIG. 5 shows the input-output time sequence diagram of five stages T1-T5. Hereinafter, 1 represents a high-level signal, and 0 represents a low-level signal.

In T1 stage, Input=1, CLKB=0, CLK=1, Reset=0, Stop=0, DIR1=1. Because Input=1, the first TFT (M1) is turned on, and the DIR1 and pull-up node (PU) are connected so that the pull-up node (PU) is at a high-level, and the third TFT (M3) is turned on. The first capacitor (C1) is charged at the same time. The third TFT (M3) in an on-state controls the shift register to start to work. At this time, because the CLKB=0, the signal output port (Output) outputs a low-level signal. And because the CLK=1, the fourth TFT (M4) is in an on-state, so that the signal output port (Output) and the low-level signal port (VGL) are connected, the noise of the signal output port (Output) may be reduced to a low-level in time. The T1 stage is a charging stage of the first capacitor (C1).

In T2 stage, Input=0, CLKB=1, CLK=0, Reset=0, Stop=0. At this time, the first TFT (M1) and the fourth TFT (M4) are turned off. Because of the self-elevation of the first capacitor (C1), the level at the pull-up node (PU) is further elevated. The third TFT (M3) is still in an on-state, and because the CLKB=1 at this time, the signal output port (Output) outputs the high-level signal. At the time that the signal output port (Output) outputs the high-level signal, the high-level signal outputted by the signal output port (Output) is inputted into the signal input port (Input) of the next shift register to charge the pull-up node (PU) of the next shift register. At the time that the high-level signal outputted by the signal output port (Output) is inputted into t the signal reset port (Reset) of the previous shift register. The T2 stage is a working stage of the shift register.

In T3 stage, Input=0, CLKB=0, CLK=1, Reset=1, Stop=0, DIR2=0. Because Input=0, the first TFT (M1) is turned off. Because Reset=1, the second TFT (M2) is turned on, so as to connect the pull-up node (PU) and second reference signal port (DIR2), and the level at the pull-up node (PU) is reduced to a low-level. Because CLK=1, the fourth TFT (M4) is turned on, so as to connect the low-level signal port (VGL) and the signal output port (Output). Thus, the signal output port (Output) outputs a low-level signal to the gate line connected with the signal output port, so as to turn off all the TFTs connected with the gate line within the display region of the display panel of the display device. The T3 stage is a reset stage of the shift register.

In T4 stage, Input=0, CLKB=1, CLK=0, Reset=0, Stop=0. Because Input=0, the first TFT (M1) is turned off. Because Reset=0, the second TFT (M2) is turned off. Because CLK=0, the fourth TFT (M4) is turned off. At this time, CLKB=1, the second capacitor (C2) is charged, a level at the pull-down node (PD) is elevated to a high-level, so as to turn on the seventh TFT (M7) and connect the signal output port (Output) and the low-level signal port (VGL). The signal output port (Output) outputs a low-level signal. The T4 stage is the pull-down stage of the shift register.

In T5 stage, Input=0, CLKB=0, CLK=0, Reset=0, Stop=1. Because Stop=1, the fifth TFT (M5) and the sixth TFT (M6) are turned on. The fifth TFT (M5) in an on-state elevates the pull-down (PD) to a high-level, so as to turn on the seventh TFT (M7) and the ninth TFT (M9). Because the seventh TFT (M7) is turned on, the signal output port (Output) and the low-level signal port (VGL) are connected to ensure the signal output port (Output) outputs a low-level signal. Because the ninth TFT (M9) is turned on, the pull-up node (PU) and the low-level signal port (VGL) are connected. The sixth TFT (M6) in an on-state may also connect the pull-up node (PU) and the low-level signal port (VGL) at the same time to ensure the noise of the pull-up node may be outputted. The T5 stage is a non-working time period of the shift register.

Figure 6:
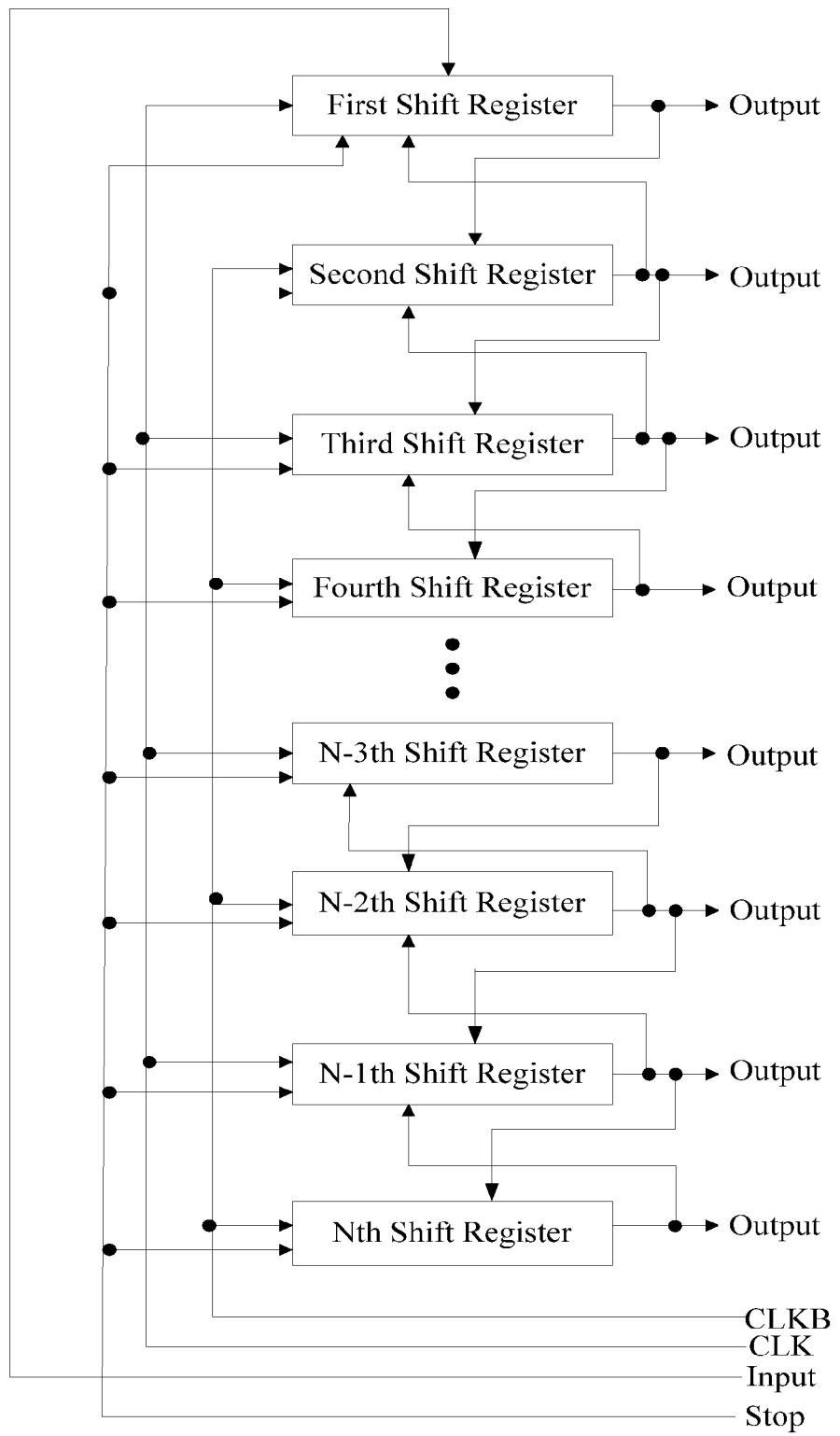
FIG. 6 is a schematic structural view showing a gate electrode driver circuit according to an embodiment of the present disclosure.

Based on the same inventive concept, the present disclosure also provides a gate electrode driver circuit, as shown in FIG. 6. The gate electrode driver circuit includes a plurality of shift registers provided by the present disclosure connected in series. Except the first shift register and the last shift register, a signal output port (Output) of every other shift register sends a triggering signal to a signal input port (Input) of a next adjacent shift register. Except the first shift register and the last shift register, the signal output port (Output) of every other shift register sends a reset signal to a reset signal port (Reset) of a previous adjacent shift register. A signal output port (Output) of the first shift register sends a triggering signal to a signal input port (Input) of the second shift register. A signal output port (Output) of the last shift register sends a reset signal to the reset signal port (Reset) of a previous shift register.

For the convenience of illustration, only eight shift registers are shown in FIG. 6, including the first shift register, the second shift register, the third shift register, the fourth shift register, the N-3 shift register, the N-2 shift register, the N-1 shift register, and the N shift register. The signal output port (Output) of the N-1 shift register not only outputs a gate initiation signal to the gate line connected with the N-1 shift register, but also outputs a reset signal to the N-2 shift register, and outputs a triggering signal to the N shift register at the same time.

Specifically, each shift register in the gate driver circuit has the same function and structure as the shift register provided by the present disclosure.

Based on the same invention concept, the present disclosure also provides an array substrate, including a gate electrode driver circuit provided by the present disclosure, a gate line connected with a signal output port of a shift register of the gate electrode driver circuit, a TFT, a data line, and a pixel electrode. A gate electrode of the TFT is connected with the gate line. A source electrode of the TFT is connected with the data line. A drain electrode of the TFT is connected with the pixel electrode.

In the array substrate provided by the present disclosure, when a local picture is displayed by the display device, under the control of the stop signal input port (Stop), the signal output port (Output) of each shift register of the gate electrode driver circuit outputs a low-level signal to the gate line connected with the signal output port, so as to turn off all the TFTs of each corresponding gate line within the display region of the display panel of the display device. Thus, the signals of the data lines may not be inputted to the pixel electrode, and the pixel electrode is stopped from driving so as to display the black background other than the local picture. Compared with prior art, i.e., when a local picture is displayed by the display device, each shift register of the display device keeps outputting high-level signals to each corresponding gate line in turn to turn on all the TFTs of the gate lines, and to enable the transmission of the signals from the data lines to the pixel electrodes to drive the pixel electrodes, the shift register of this embodiment may reduce the power consumption of the display device.

Based on the same inventive concept, the present disclosure also provides a display device, including an array substrate provided by the present disclosure and a driver circuit of the array substrate.

In another embodiment, a method for driving a display device is provided by the present disclosure. Specifically, a driver circuit of the display device receives external video data, when the external video data is determined to display a local picture and after the local picture is displayed, a stop display signal is sent to a stop signal input port of each of shift registers in the display device. A signal output port of the shift register sends a low-level signal to a gate line connected to the shift register when the stop display signal is received by the shift register.

Figure 7:
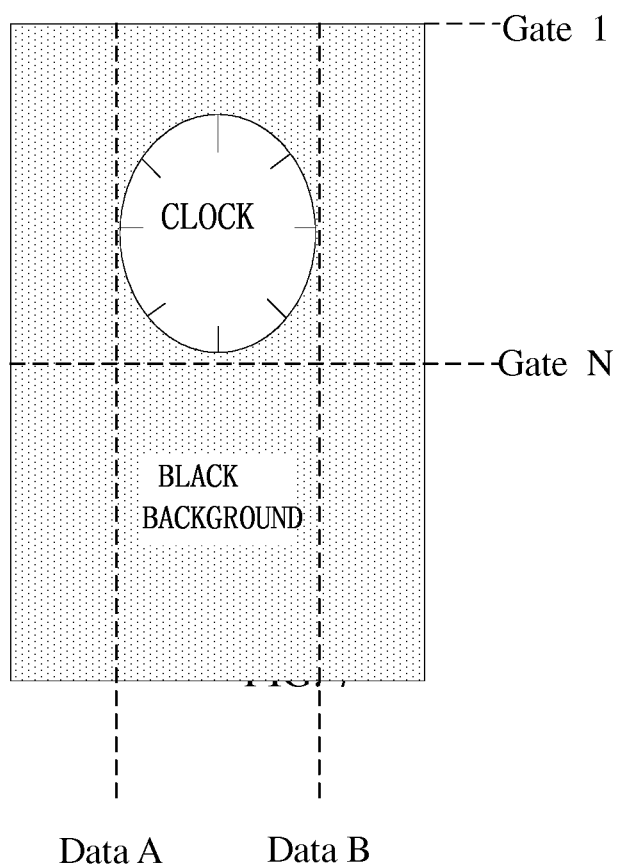
FIG. 7 is a schematic view showing a local picture displayed by a display device according to an embodiment of the present disclosure.

For example, as shown in FIG. 7, when the display device is in a standby status, a clock picture is displayed. Most of the screen is in black background except the part of the screen corresponding to the clock picture. The driver circuit in the display device determines the clock picture is displayed until the Nth gate line. Therefore, after the outputting of the Nth gate line is finished, i.e., after the display of the local picture is finished, a stop display signal is sent to each shift register of the display device. The stop display signal is kept at a high-level and s changed to a low-level when an initiation signal of a next frame is received. During the process that the gate line (Gate) scans from the first line to the Nth line, because the surrounding picture only displays a black background, only the data lines (Data) of the clock region need to output video data signal. Thus, data lines (Data) only need to output from line A to line B. In addition, after every ten frames or twenty frames, a complete scanning of all gate electrodes may be performed to keep other part of the display panel in the black background. Thus, the goal of reducing the power consumption when the local picture is displayed by the display device is achieved.

In another embodiment, the method for driving the display device includes further steps. At the same time that the driver circuit sends the stop display signal to the stop signal input port (Stop) of each of the shift registers in the display device, the low-level signal is sent to a source driver circuit of the display device such that a data line connected with the source driver circuit is loaded with the low-level signal.

In the method for driving the display device provided by the present disclosure, after the driver circuit receives external video data and the external video data is determined to display a local screen picture, and after the local screen picture is displayed, a stop display signal is sent to a stop signal input port (Stop) of each of shift registers in the display device. A signal output port (Output) of the shift register sends a low-level signal to a gate line connected to the shift register when the stop display signal is received by the shift register, such that the gate line stops scanning the display panel. At the same time that the driver circuit sends the stop display signal to the stop signal input port (Stop) of each shift register of the display device, a low-level signal is sent to the source driver circuit of the display device, such that the data line connected with the source driver circuit is loaded with the low-level signal to display the black background except the local picture. Compared with the prior art, i.e., when a local picture is displayed by the display device, each shift register circuit of the display device keeps outputting high-level signals to each corresponding gate line to conduct normal scanning, the shift register of this embodiment may reduce the power consumption of the display device.

The present disclosure provides a shift register, a gate electrode driver circuit, an array substrate, a display device, and a method for driving the display device. A pull-down module and a stop module are added in the shift register. When a full screen picture is displayed by the display device, the signal output port of the shift register outputs a high-level signal to the gate line connected with the signal output port, such that the gate line scans the display panel of the display device normally to display full screen picture. In addition, the pull-down module may maintain the pull-up node and the signal output port at a low-level during the non-working time of the shift register, so as to prevent the shift register from outputting noise. When a local picture is displayed by the display device, under the control of the stop signal input port Stop, the stop module of the shift register maintains the signal output port at a low-level, i.e., the signal output port outputs the low-level signal to the gate line connected with the signal output port, such that the gate line stops scanning the display panel to display black background except the local picture. Compared with the prior art, i.e., when a local picture is displayed by the display device, each shift register circuit of the display device keeps outputting high-level signals to each corresponding gate line to conduct normal scanning, the shift register of this embodiment may reduce the power consumption of the display device.

The above are merely the preferred embodiments of the present disclosure, and the present disclosure is not limited thereto. Obviously, a person skilled in the art may make further modifications and alterations without departing from the spirit and essence of the present invention, and these modifications and alternations shall also fall within the scope defined by the attached claims.

What is claimed is:

1. A shift register, comprising: a pull-up driver module, a pull-down driver module, a pull-up control module, a pull-down control module, a pull-down module, and a stop module, wherein:
   the pull-up driver module is configured to turn on the pull-up control module through a pull-up node under a control of a signal input port and a first reference signal port;
   the pull-down driver module is configured to turn off the pull-up control module through the pull-up node under a control of a reset signal port and a second reference signal port;
   the pull-up control module is configured to connect a first clock signal port and a signal output port under a control of the pull-up node;
   the pull-down control module is configured to connect a low-level signal port and the signal output port under a control of a second clock signal port;
   the pull-down module is configured to maintain the pull-up node and the signal output port at a low-level during non-working time of the shift register, and to be connected with the signal output port, the pull-up node, the low-level signal port, and the first clock signal port; and
   the stop module is configured to maintain the signal output port at the low-level under a control of a stop signal input port, and to be connected with the stop signal input port, the pull-up node, the pull-down module, and the low-level signal port,
   wherein the stop module comprises a first thin film transistor (TFT) and a second TFT, a gate electrode of the first TFT and a drain electrode of the first TFT both being connected with the stop signal input port, a source electrode of the first TFT being connected with the pull-down module, a gate electrode of the second TFT being connected with the stop signal input port, a drain electrode of the second TFT being connected with the pull-up node, and a source electrode of the second TFT being connected with the low-level signal port.

2. The shift register according to claim 1, wherein:
   the pull-up driver module comprises a third TFT, a gate electrode of the third TFT being connected with the signal input port, a drain electrode of the third TFT being connected with the first reference signal port, and a source electrode of the third TFT being connected with the pull-up node;
   the pull-down driver module comprises a fourth TFT, a gate electrode of the fourth TFT being connected with the reset signal port, a drain electrode of the fourth TFT being connected with the pull-up node, a source electrode of the fourth TFT being connected with the second reference signal port;
   the pull-up control module comprises a fifth TFT and a first capacitor, wherein a gate electrode of the fifth TFT is connected with the pull-up node, a source electrode of the fifth TFT is connected with the first clock signal port, wherein a drain electrode of the fifth TFT is connected with the signal output port, and the first capacitor is connected between the pull-up node and the signal output port; and
   the pull-down control module comprises a sixth TFT, wherein a gate electrode of the sixth TFT is connected with the second clock signal port, a drain electrode of the sixth TFT is connected with the signal output port, and a source electrode of the sixth TFT is connected with the low-level signal port.

3. The shift register according to claim 1, wherein when a high-level signal is inputted into the stop signal input port, the first TFT is turned on, the first TFT being on turns on the pull-down module such that the signal output port and the low-level signal port are connected.

4. The shift register according to claim 1, wherein the pull-down module comprises:
   a seventh TFT, wherein a gate electrode of the seventh TFT is connected with a pull-down node, a source electrode of the seventh TFT is connected the signal output port, and a drain electrode of the seventh TFT is connected with the low-level signal port;
   an eighth TFT, wherein a gate electrode of the eighth TFT is connected with the pull-up node, a drain electrode of the eighth TFT is connected with the low-level signal port, and a source electrode of the eighth TFT is connected with the pull-down node;
   a ninth TFT, wherein a gate electrode of the ninth TFT is connected with the pull-down node, a source electrode of the ninth TFT is connected with the pull-up node, and a drain electrode of the ninth TFT is connected with the low-level signal port; and
   a second capacitor, wherein the second capacitor is connected between the pull-down node and the first clock signal port.

5. The shift register according to claim 2, wherein the pull-down module comprises:
   a seventh TFT, wherein a gate electrode of the seventh TFT is connected with a pull-down node, a source electrode of the seventh TFT is connected the signal output port, and a drain electrode of the seventh TFT is connected with the low-level signal port;
   an eighth TFT, wherein a gate electrode of the eighth TFT is connected with the pull-up node, a drain electrode of the eighth TFT is connected with the low-level signal port, and a source electrode of the eighth TFT is connected with the pull-down node;
   a ninth TFT, wherein a gate electrode of the ninth TFT is connected with the pull-down node, a source electrode of the ninth TFT is connected with the pull-up node, and a drain electrode of the ninth TFT is connected with the low-level signal port; and a second capacitor, wherein the second capacitor is connected between the pull-down node and the first clock signal port.

6. The shift register according to claim 3, wherein the pull-down module comprises:
  a seventh TFT, wherein a gate electrode of the seventh TFT is connected with a pull-down node, a source electrode of the seventh TFT is connected the signal output port, and a drain electrode of the seventh TFT is connected with the low-level signal port;
  an eighth TFT, wherein a gate electrode of the eighth TFT is connected with the pull-up node, a drain electrode of the eighth TFT is connected with the low-level signal port, and a source electrode of the eighth TFT is connected with the pull-down node;
  a ninth TFT, wherein a gate electrode of the ninth TFT is connected with the pull-down node, a source electrode of the ninth TFT is connected with the pull-up node, and a drain electrode of the ninth TFT is connected with the low-level signal port; and
  a second capacitor, wherein the second capacitor is connected between the pull-down node and the first clock signal port.

7. The shift register according to claim 1, wherein the signal input port and the reset signal port are in symmetrical design so as to achieve dual-scanning.

8. The shift register according to claim 7, wherein when a forward scanning is started, the first reference signal port provides a high-level signal, and the second reference signal port provides a low-level signal; or
  when a reverse scanning is started, the first reference signal port provides a low-level signal, and the second reference signal port provides a high-level signal.

9. A display device, comprising an array substrate and a driver circuit of the array substrate,
  wherein the array substrate comprises a gate electrode driver circuit comprising a plurality of shift registers according to claim 1 connected in series, a gate line connected with a signal output port of the shift register of the gate electrode driver circuit, a TFT, a data line, and a pixel electrode, wherein a gate electrode of the TFT is connected with the gate line; a source electrode of the TFT is connected with the data line; and a drain electrode of the TFT is connected with the pixel electrode,
  wherein, except a first shift register and a last shift register, a signal output port of every other shift register sends a triggering signal to a signal input port of a next adjacent shift register and sends a reset signal to a reset signal port of a previous adjacent shift register; wherein a signal output port of the first shift register sends a triggering signal to a signal input port of the second shift register; and a signal output port of the last shift register sends a reset signal to the reset signal port of a previous shift register.

10. A method for driving a display device according to claim 9, comprising:
  receiving external video data, by a driver circuit of the display device, wherein when the external video data is determined to display a local picture, after the local picture is displayed, a stop display signal is sent to a stop signal input port of each of shift registers in the display device; and
  sending, by a signal output port of the shift register, a low-level signal to a gate line connected to the shift register when the stop display signal is received by the shift register.

11. The method for driving the display device according to claim 10, further comprising:
  at the same time that the driver circuit sends the stop display signal to the stop signal input port of each of the shift registers in the display device, sending the low-level signal to a source driver circuit of the display device such that a data line connected with the source driver circuit is loaded with the low-level signal.

* * * * *